United States Patent [19]
Solo de Zaldivar

[11] Patent Number: 5,385,857
[45] Date of Patent: Jan. 31, 1995

[54] METHOD OF MANUFACTURING A SEMICONDUCTOR DEVICE WITH HIGH PACKING DENSITY AND HAVING FIELD EFFECT TRANSISTORS

[75] Inventor: José Solo de Zaldivar, Zürich, Switzerland

[73] Assignee: U.S. Philips Corporation, New York, N.Y.

[21] Appl. No.: 995,101

[22] Filed: Dec. 21, 1992

[30] Foreign Application Priority Data

Dec. 23, 1991 [EP] European Pat. Off. ........... 91203376

[51] Int. Cl.[6] .......................................... H01L 21/265
[52] U.S. Cl. ...................................... 437/44; 437/41; 437/186
[58] Field of Search ..................... 437/40, 41, 44, 186, 437/187, 45

[56] References Cited

U.S. PATENT DOCUMENTS

| | | | |
|---|---|---|---|
| 4,364,167 | 12/1982 | Donley | 29/576 |
| 4,786,609 | 11/1988 | Chen | 437/30 |
| 4,992,389 | 2/1991 | Ogura et al. | 437/41 |
| 5,153,144 | 10/1992 | Komori et al. | 437/43 |
| 5,192,992 | 3/1993 | Kim et al. | 257/370 |
| 5,217,923 | 6/1993 | Suguro | 437/200 |
| 5,219,777 | 6/1993 | Kang | 437/44 |
| 5,229,326 | 7/1993 | Dennison et al. | 437/195 |

FOREIGN PATENT DOCUMENTS

0081999 12/1982 European Pat. Off. .
0187016 12/1985 European Pat. Off. .

Primary Examiner—George Fourson
Assistant Examiner—David Mason
Attorney, Agent, or Firm—Steven R. Biren

[57] ABSTRACT

A method of manufacturing a semiconductor device having a field effect transistor and a device manufactured by this method in which a high packing density can be realized. The field effect transistor includes a gate electrode (31,41) which is separated from a channel region by a first insulating layer (8) and is entirely surrounded by insulating material. For this purpose, a conductive layer (9) which is to form a gate electrode (31,41) is covered with a second insulating layer (10) and both layers are subsequently given the same pattern at least at the area of the channel region. As a result, the gate electrode (31,41) is covered at the upper side with a portion of the second insulating layer (10). The gate electrode (31,41) is laterally insulated by the provision of a third insulating layer (13) which is subsequently etched back anisotropically, whereby a portion (14) thereof remains intact afterwards alongside the side wall of the gate electrode (31,41). At least the source (32,42) or the drain (33,43) of the transistor is provided with an electrical connection (20) which makes contact through a contact window (19) in a further insulating layer (19). Due to the complete insulation of the gate electrode (31,41), the contact window (19) is allowed to overlap the associated gate electrode (31,41), so no alignment tolerances need be taken into account relative to the gate electrode (31,41) for forming this window (19).

8 Claims, 3 Drawing Sheets

METHOD OF MANUFACTURING A SEMICONDUCTOR DEVICE WITH HIGH PACKING DENSITY AND HAVING FIELD EFFECT TRANSISTORS

BACKGROUND OF THE INVENTION

The invention relates to a method of manufacturing a semiconductor device whereby a field effect transistor is provided at a surface of a semiconductor body, which transistor comprises a source and a drain of a first conductivity type mutually separated by a channel region of a second, opposite conductivity type and comprising a gate electrode which is insulated from the channel region by a first insulating layer, whereby the first insulating layer is provided on the surface of the semiconductor body and is covered with a conductive layer, an etching mask is provided and a gate electrode is etched from the conductive layer under the masking of this mask, exposed portions of the gate electrode are covered with insulating material, the semiconductor body is doped with an impurity on both sides of the gate electrode for the formation of the source and drain, the assembly is covered with a further insulating layer which at the area of at least either the source or the drain is provided with a contact window which lies partly above the gate electrode, and an electrical connection is provided via the contact window.

In such a method, whereby the gate electrode is entirely encapsulated in insulating material, any contact windows to the source and the drain are allowed to lie partly above the gate electrode. When these windows are provided, accordingly, no alignment tolerances relative to the gate electrode need be taken into account, so that a considerable higher packing density can be realized.

A method of the kind mentioned in the opening paragraph is known from a European patent application which was laid open to public inspection under no. 81.999. In the method described therein, the gate electrode is formed from a conductive layer of doped polycrystalline silicon. The exposed portions of the gate electrode are covered with insulating material in that the entire assembly is subjected to an oxidizing atmosphere, so that a layer of silicon oxide is formed on the gate electrode. Adjacent the gate electrode, the semiconductor body is (still) undoped at that moment with the object of growing a substantially thinner silicon oxide layer thereon. After the source and drain have been formed, a further silicon oxide layer is deposited into which contact windows are etched at the areas of the source and drain. Owing to the greater oxide thickness at the area of the gate electrode compared with said thickness at the area of the source and the drain, the contact windows need not be aligned relative to the gate electrode.

The known method, however, has the disadvantage that restrictions are imposed on the choice of material for the contacting layer. This is because the gate electrode must have an oxidizable surface in the known method. In addition, the known method is found to be not well reproducible in practice for field effect transistors of very small dimensions, for example, with a source to drain distance below 2 $\mu$m. This latter disadvantage is supposed to be due to an encroachment on the gate dielectric during the thermal oxidation of the gate electrode leading to a so called 'bird's beak' under the gate electrode.

SUMMARY OF THE INVENTION

The invention has for its object inter alia to disadvantages provide a method of the kind mentioned in the opening paragraph which is reproducible, even for very small to sub-micron dimensions, without imposing special requirements on the material of the gate electrode.

According to the invention, a method of the kind mentioned in the opening paragraph is characterized in that the conductive layer is covered with a second insulating layer before the etching mask is provided, in that the second insulating layer is etched into a pattern under masking by the etching mask, in that after the formation of the gate electrode a third insulating layer is deposited on the assembly and subsequently anisotropically etched in such a manner that afterwards a portion thereof remains along the edge of the gate electrode, and in that via the contact window an electrical connection is provided which extends at least partly over the gate electrode.

In the method according to the invention, the gate electrode is entirely encapsulated in insulating material in that it is covered at the top by a portion of the second insulating layer and on either side by a portion of the third insulating layer. Both portions are provided through deposition and etching, so that no special requirements are imposed on the material of the gate electrode itself and the gate dielectric is not attacked.

The second and third insulating layers need not be made of different materials which are etchable relative to one another. Also if the second and third insulating layers are made of the same material, or when their mutual etching selectivity is poor, it is found that the third insulating layer can be safely etched back without exposing the gate electrode. In that case, the second insulating layer may simply be chosen to be sufficiently thick for adequately protecting the gate electrode afterwards. In all cases the invention is found to provide an extremely reliable method with a high reproducibility; also for the manufacture of semiconductor devices comprising field effect transistors of very small dimensions.

A preferred embodiment of the method according to the invention is characterized in that, before the etching mask is provided, the second insulating layer is locally removed from the conductive layer and in that a contact region of the conductive layer thus exposed is covered at least in part by the etching mask. In that case a portion of the conductive layer not covered by the second insulating layer remains behind afterwards. In a further embodiment, the further insulating layer is provided in that location with a contact window in which an electrical connection is realized. The electrical connection may form an ohmic connection to the contact region, in which case a gate electrode connection can be realized. It is alternatively possible, however, for the electrical connection to form a capacitance electrode. In that case the method according to the invention is preferably characterized in that at least the contact region of the conductive layer is covered with a dielectric, in that the dielectric is exposed in the contact window, and in that the electrical connection is provided on the dielectric in the contact window.

A special embodiment of the method according to the invention has the additional advantage that a field effect transistor with a so-called LDD configuration can be realized thereby in a simple manner. In such a configuration at least the drain comprises two portions: a comparatively weakly doped portion by which the drain adjoins the channel region and a more heavily doped portion which is further away from the channel region and where the drain can be contacted.

The special embodiment of the method according to the invention is for this purpose characterized in that, before the third insulating layer is provided, the semiconductor body on either side of the gate electrode is doped with an impurity of the first conductivity type so as to form a first, comparatively weakly doped portion of the source and the drain, and in that, after said portion along the gate electrode has been formed from the third insulating layer, the semiconductor body is once more doped with an impurity of the first conductivity type so as to form a second, comparatively heavily doped portion of the source and the drain.

Since the semiconductor body should be undoper at the moment at which an insulating edge portion is formed on either side of the gate electrode in the known method, the known method is not suitable for the manufacture of a device comprising such field effect transistors without special measures.

The invention further relates to a semiconductor device comprising a semiconductor body provided with a field effect transistor with a source and a drain of a first conductivity type mutually separated by a channel region of a second, opposite conductivity type, and with a gate electrode which is separated from the channel region by a first insulating layer, the source and drain both adjoining the channel region with a comparatively weakly doped portion and the entire assembly being covered by a further insulating layer which at the area of at least either the source or the drain is provided with a contact window in which an electrical connection is provided.

Such a semiconductor device is known from a European patent application laid open to public inspection under no. 187.016. In the known device, the gate electrode lies immediately below the further insulating layer which in this case comprises a comparatively thick silicon oxide layer. At the areas of both the source and the drain, the silicon layer is provided with contact windows in which electrical connections are provided by means of which the source and the drain are contacted.

The known device has the disadvantage that the contact windows for the source and the drain are not allowed to extend over the gate electrode, since in that case short-circuiting to the gate electrode would inevitably occur. This means that alignment tolerances are to be taken into account during the provision of the contact windows, which requires space.

The invention also has for its object inter alia to provide a semiconductor device in which such alignment tolerances can be avoided so that the field effect transistor can be realized on a smaller surface area.

According to the invention, a semiconductor device of the kind described above is for this purpose characterized in that the gate electrode is covered with a second insulating layer under the further insulating layer, in that the second insulating layer and the gate electrode have identical patterns, in that the contact window lies partly above the gate electrode and in that the electrical connection extends partly over the gate electrode and is electrically insulated therefrom by at least the second insulating layer. Since in this device the gate electrode is covered by the second insulating layer below the further insulating layer, a contact window to the source or the drain may be provided above the gate electrode without any risk of short-circuiting. This is because the second insulating layer insulates the source or drain connection from the gate electrode. As a result, the contact windows may be provided without alignment tolerances.

A further embodiment of the semiconductor according to the invention is in addition characterized in that the second insulating layer leaves the gate electrode uncovered at the area of a contact region thereof and in that the further insulating layer is provided with a contact window at the area of the contact region, in which window an electrical connection is provided.

In a particular embodiment, the semiconductor device according to the invention is characterized in that a first capacitance electrode of at least substantially the same composition and thickness as the gate electrode is provided on the first insulating layer, in that the second insulating layer leaves the first capacitance electrode at least partly uncovered, in that the further insulating layer is provided with a contact window at the area of the first capacitance electrode, and in that a second capacitance electrode is provided via the contact window, the said two capacitance electrodes being mutually separated by a dielectric. In a further embodiment thereof, an etch stop layer relative to which the further insulating layer is selectively etchable lies below the further insulating layer, which etch stop layer at least partly forms the dielectric.

BRIEF DESCRIPTION OF THE DRAWING

The invention will now be described in more detail with reference to a drawing, in which.

Figure 1:
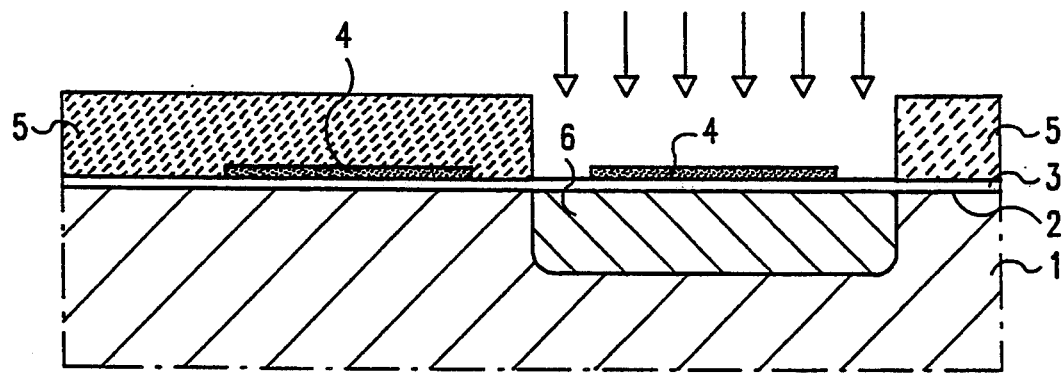
FIGS. 1 to 9 diagrammatically and in cross-section show subsequent stages of an embodiment of the method according to the invention.

The Figures are purely diagrammatic and not drawn to scale. Some dimensions have been particularly exaggerated for greater clarity. Semiconductor regions of the same conductivity type have generally been hatched in the same direction, and corresponding parts have generally been given the same reference numerals.

DESCRIPTION OF THE PREFERRED EMBODIMENTS

The starting point is a semiconductor body 1 of p-type silicon shown in FIG. 1. The semiconductor body is thermally oxidized at a surface 2 to form a thin silicon oxide layer 3. On the oxide layer 3, an oxidation mask 4 in the form of a silicon nitride layer is provided, which layer has been patterned by usual photolithographic methods. The assembly is subsequently provided with an implantation mask 5 of photoresist, after which phosphorus is locally implanted into the semiconductor body to form an n-type semiconductor region 6 in which later a p-channel field effect transistor will be formed.

Figure 2:
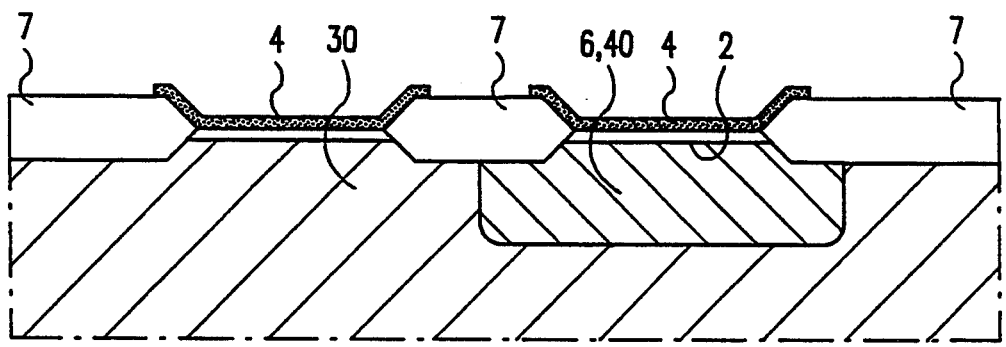

After the implantation mask 5 has been removed, the assembly is exposed to an oxidizing environment of steam for an extended period at a temperature of approximately 850° C., whereby a partly recessed insulation region 7 of silicon oxide is grown at the surface 2, see FIG. 2. The insulation region 7 encloses a p-type island-shaped part 30 of the semiconductor body 1 as well as an n-type island-shaped part 40 of the semiconductor region 6 which has been diffused further into the semiconductor body 1 during the thermal oxidation. An n-channel field effect transistor will be realized in the p-type island-shaped part 30. If required, the doping concentration in this part may additionally be adjusted by means of a separate doping step.

After the insulation region has been formed the oxidation mask 4 is removed and the surface 2 of the semiconductor 1 is exposed by means of a short oxide etching treatment. Then an approximately 30 nm thick first insulating layer 8 of silicon oxide is grown by thermal oxidation, see FIG. 3, which oxide will form the gate dielectric for the transistors to be realized. After that, a conductive layer 9 of n-type polycrystalline silicon and a second insulating layer 10 of silicon oxide are deposited over the assembly in that order. The second insulating layer is provided in this example through deposition from the gas phase (CVD) of TEOS to a thickness of approximately 300 nm.

Figure 3:
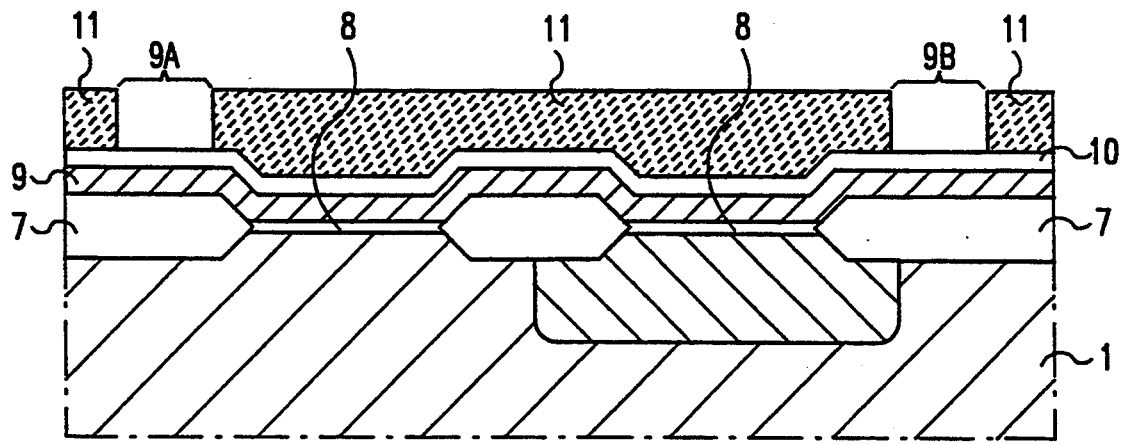
Figure 4:
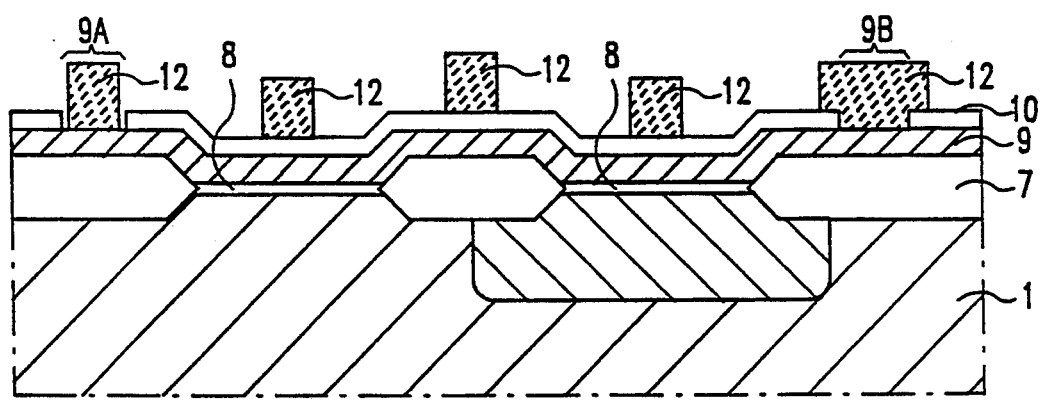

Then a layer of photoresist 11 is provided and patterned by means of photolithograpic processes which are known per se, see FIG. 3. Under masking by the photoresist layer 11, the second insulating layer 10 is locally etched away from the polycrystalline silicon layer 9, see FIG. 4. Thus contact regions 9A, 9B are defined in the silicon layer 9 where at a later stage a gate electrode connection and a capacitance, respectively, will be formed.

After the photoresist layer 11 has been removed, an etching mask 12 is provided on the layer structure, defining inter alia the gate electrodes of the transistors to be formed. The etching mask 12 also covers the previously defined contact regions 9A, 9B at least partly. The alignment of the mask 12 relative to the two contact regions 9A, 9B is not very critical. As shown, the mask 12 covers the first contact region 9A only partly, whereas it extends outside the other contact region 9B without leading to any problems.

Figure 5:
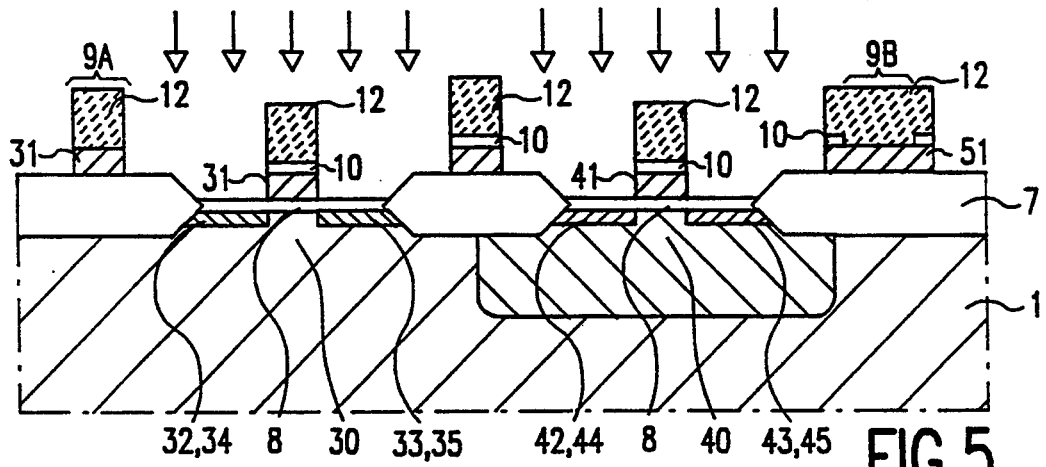

The second insulating layer 10 is then etched into a pattern under masking by the etching mask 12, after which the conductive layer 9 is etched using the same mask. In this manner, gate electrodes 31,41 are formed from the silicon layer 9, which electrodes are covered at the upper side with a remaining portion of the second insulating layer 10 which at the areas of the island-shaped pans 30,40 follows the same pattern as the gate electrode 31,41, see FIG. 5. The gate electrode 31 of the n-channel transistor is formed by a continuous silicon track which at the same time comprises the electrode region 9A. The gate electrode 41 of the p-channel transistor is connected to a contact region in a similar fashion. In addition, a first capacitance electrode 51 comprising the contact region 9B is etched from the silicon layer 9.

Under masking by the gate electrode 31 of the n-channel transistor phosphorus is implanted into the semiconductor body 1 with a dose of approximately $3.10^{13}$ m$^{-2}$ on either side of the gate electrode 31 at the area of the first island-shaped part 30 so as to form comparatively weakly doped portions 34,35 of a source 32 and a drain 33, respectively for the n-channel transistor to be formed. During this implantation, the second island-shaped pan 40 is covered under a photoresist layer (not shown). In a similar manner a boron implantation is carried out at the area of the second island-shaped pan 40 with a dose of approximately $2.10^{13}$ cm$^{-2}$ so as to form comparatively weakly doped portions 44,45 for the source 42 and drain 43 of the p-channel transistor to be formed here. It should be noted that these doping steps may be omitted for the manufacture of a device having field effect transistors which, in contrast with the transistors formed here, do not have a so-called LDD structure but which have an evenly doped source and drain.

The portion of the first island-shaped part 30 and of the second island-shaped part 40 situated under the gate electrode 31,41 respectively and between the associated source 32,42 and drain 33,43 form channel regions for the two transistors in question. If so desired, the threshold voltages of the transistors may be further adjusted in that a suitable dopant is implanted therein in order to bring the net doping concentration in the channel regions to the desired level.

Figure 6:
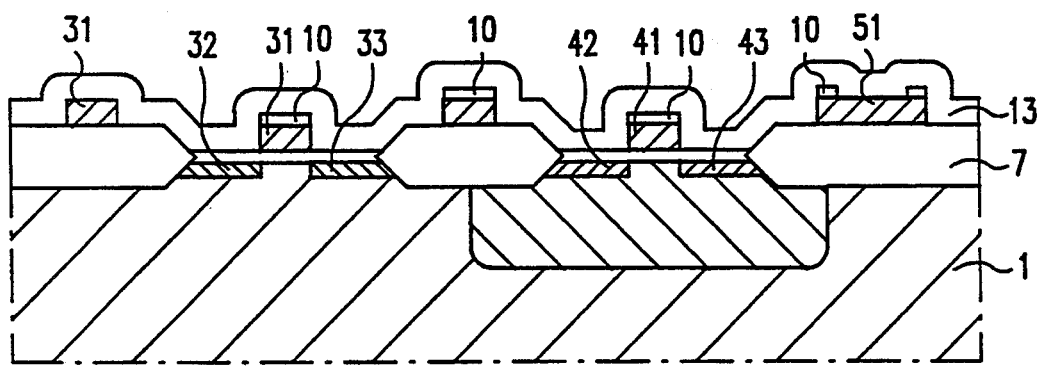

The assembly is subsequently covered with a third insulating layer 13, see FIG. 6, in order to cover at least the gate electrodes 31,41 with insulating material not only at their upper side but also laterally. The third insulating layer 13 in this example comprises silicon oxide, as does the second insulating layer 10 and is also formed by deposition from the gas phase (CVD) of TEOS. Within the scope of the present invention, however, the two insulating layers 10, 13 do not have to comprise the same material.

Figure 7:
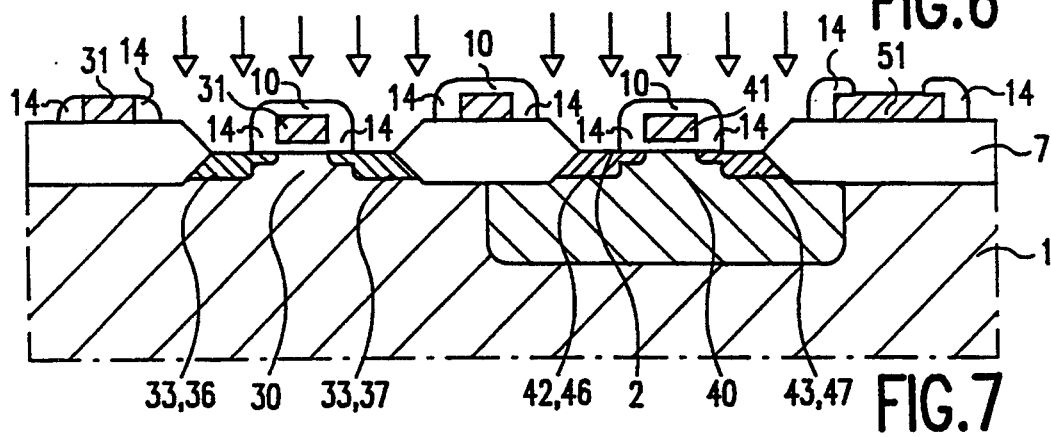

The third insulating layer 13 is subsequently etched back anisotropically, whereby exclusively horizontal portions thereof are removed. The etching process is ended the moment the surface 2 of the semiconductor body 1 is reached. At that moment vertical edge portions 14 of silicon oxide originating from the third insulating layer 13 remain alongside the gate electrodes 31,41, laterally insulating them. The obtained structure is diagrammatically shown in FIG. 7. The gate electrodes 31,41 are still covered at the upper side with silicon oxide because of the initially larger oxide thickness in this location originating from the second insulating layer 10.

A dopant is again implanted into the semiconductor body 1 on either side of the gate electrodes 31,41. Arsenic is implanted with a dose of $3.10^{15}$ cm$^{-2}$ at the area of the first island-shaped part 30 so as to form comparatively heavily doped portions 36,35, completing the source 32 and drain 33 of the n-channel transistor. The second island-shaped part 40 is covered during this with a photoresist layer so that no phosphorous can penetrate the semiconductor body 1 there. In a similar manner, boron is implanted with a dose of $1.10^{15}$ cm$^{-2}$ at the area of the second island-shaped part 40 so as to form comparatively heavily doped portions 46,47, completing the source 42 and drain 43 for the p-channel transistor, see FIG. 7.

Figure 8:
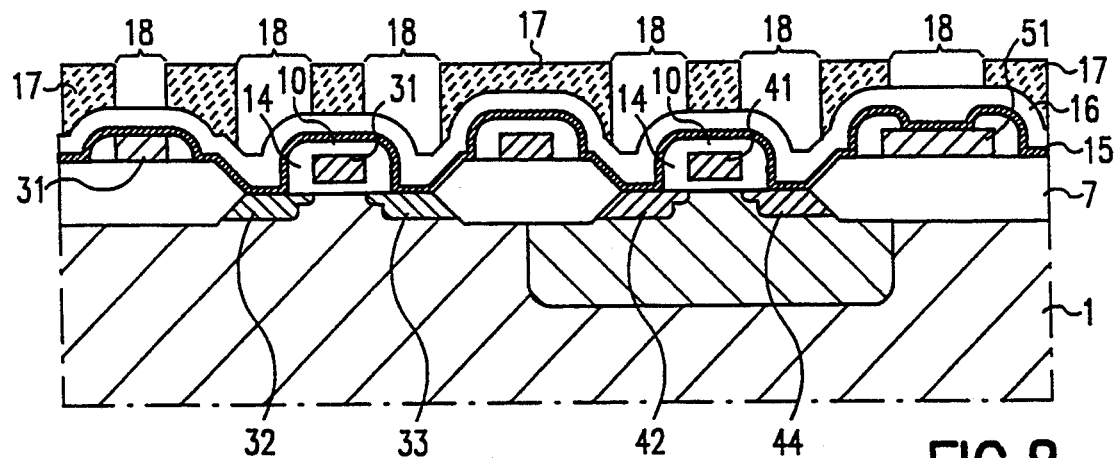

Then the assembly is now subsequently covered with a comparatively thin etch stop layer 15 of silicon nitride and a approximately 30 nm thick further insulating layer 16 of flow glass, in this example borophosphosilicate glass (BPSG), see FIG. 8. The flow glass layer 16 is selectively etchable relative to the silicon nitride layer 15 in hydrogen fluoride. Another suitable material for the etch stop layer is, for example, aluminium oxide. The nitride etch stop layer 15 is given a thickness of only about 30 nm and covers inter alia the first capacitance electrode 51 in order to constitute a dielectric for the capacitance to be formed.

It should be noted that the term "flow glass" for the purposes of the present invention is to be understood to mean silicon oxide to which an impurity has been added, such as for example boron and/or phosphorus, in such a manner that the glass starts to flow at a considerably lower temperature than pure silicon oxide. The flow point should be sufficiently low for ensuring that semiconductor structures already provided are not damaged at the flowing temperature. The BSPG layer 16 used here, for example, flows already at a temperature of 700° C., whereas thermal silicon oxide does not flow until at approximately 1700° C.

Subsequently, an etching mask 17 comprising a number of openings 18 is provided, which openings define contact windows in the further insulating layer 16. Since the gate electrodes 31,41 are completely covered with insulating material originating from the second and third insulating layer 10, 14 respectively, the openings 18 to the source 32,42 and drain 33,43 of the two transistors are allowed to overlap their associated gate electrodes 31,41, hence no alignment tolerances need be taken into account in this respect. At the opposite side, the source 32,42 and drain 33,43 of the two transistors adjoin the insulation region 7, so that no alignment tolerances are necessary there either. The alignment of the mask 17 is not very critical as a result.

Figure 9:
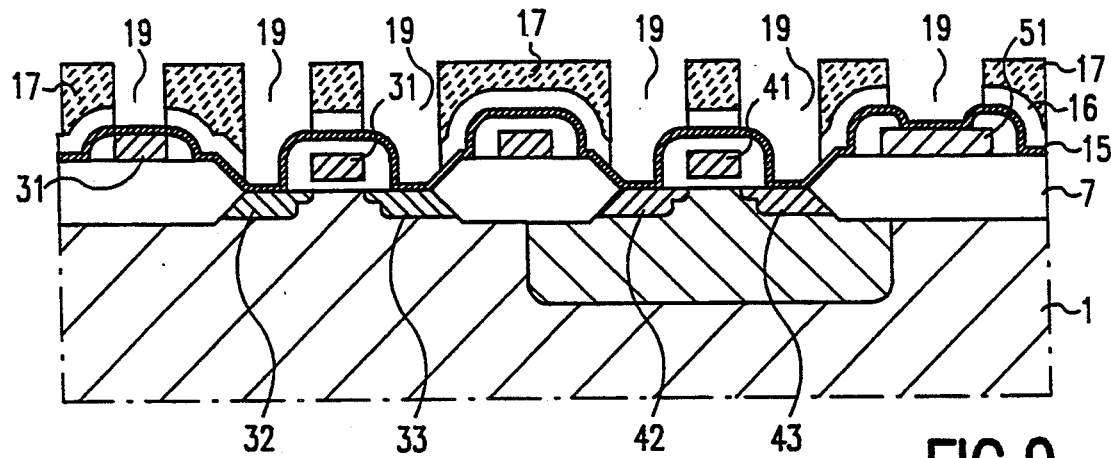

Under masking by the mask 17, contact windows 19 are etched into the further insulating layer 16, see FIG. 9. Thanks to the presence of the etch stop layer 15 below the further insulating layer 16, the windows 19 may be etched both by a wet method, for example, in hydrogen fluoride, and by a dry method in a plasma. The etch stop layer 15 will always protect the insulated gate electrodes 31,41 and the surfaces of the source 32,42 and drain 33,43 regions against etching. In the present example, the flow glass layer 16 is first etched anisotropically over two thirds of its thickness in a plasma of $CHF_3$, after which the remaining portion is isotropically removed in hydrogen fluoride. The walls of the contact windows are given an optimal slope by the initial anisotropic etching treatment. In contrast to the $CHF_3$ plasma, hydrogen fluoride has a great etching selectivity for flow glass relative to silicon nitride, so that it is perfectly well possible to stop at the nitride layer 15. The isotropic etching character of hydrogen fluoride in addition promotes that no flow glass remnants, for example small edge portions, remain behind in the contact windows 19. Besides contact windows 19 to the source, the drain and the gate electrode of both transistors, a contact window 19 is also opened at the area of the first capacitance electrode 51 exposing the dielectric 15 there. The etching mask 17 is subsequently removed after the contact windows 19 have been formed.

Prior to removing the etch stop layer 15 from the contact windows 19, a heat treatment at approximately 900° C. is given for some time, usually referred to as re-flow. During this heat treatment, the previously provided dopant diffuses further into the semiconductor body 1 and the flow glass layer 16 flows out a little so that in particular the contact windows 19 situated therein are given a more fluent profile. The etch stop layer 15 protects the subjacent silicon against thermal oxidation during this treatment and also prevents that dopants can escape from the source and drain regions and on the other hand that dopants from the flow glass layer 16 can enter the silicon. generally referred to as outdiffusion and auto-doping respectively.

After the heat treatment has been completed, the etch stop layer is removed from the contact windows 19 by means of a short etching treatment in $Cl_2$. The window 19 at the area of the first capacitance electrode 51 is covered by a non-critical photoresist mask (not shown) during this treatment, so that the dielectric 15, remains unaffected.

Figure 10:
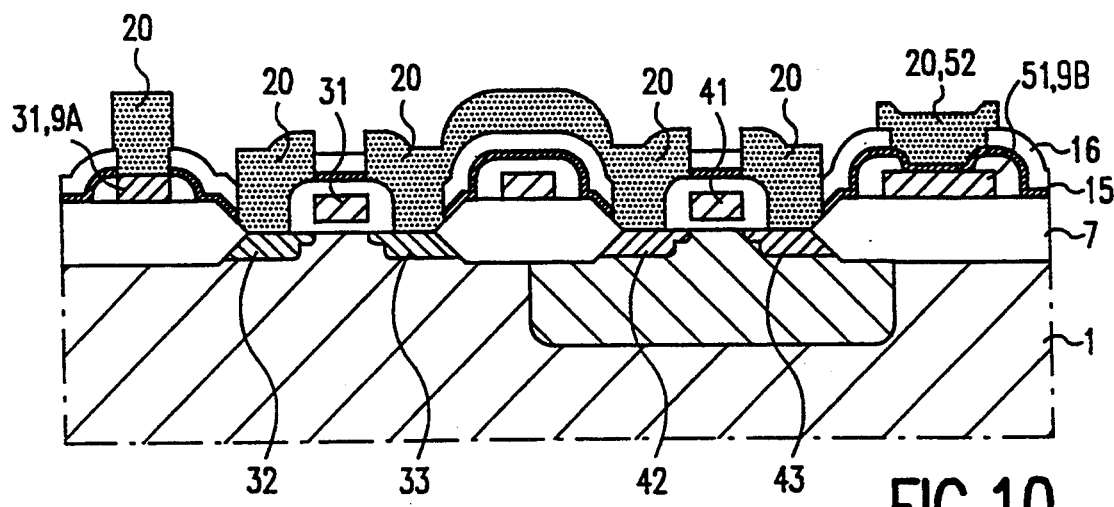
FIG. 10 shows an embodiment of the semiconductor device according to the invention in cross-section.

After the surface has been thoroughly cleaned and divested of any oxide, electrical connections 20 made of aluminium are provided in usual manner in the contact windows 19, see FIG. 10, whereby the source and drain regions 32,42,33,43 of both transistors are contacted at their comparatively heavily doped portions and the gate electrode 31 of the n-channel transistor is contacted at the area of the contact region 9A. Optionally a thin TiW layer may be provided under the aluminium contacts in order to act as a diffusion barrier under the contacts. Such a TiW layer can be etched selectively with respect to aluminium. The gate electrode 41 of the p-channel transistor is provided with an electrical connection outside the plane of the drawing in a similar manner. An electrical connection 20 is also provided on the dielectric 15 at the area of the first capacitance electrode 51. This connection forms a second capacitance electrode 52 for the capacitance, which is thus rendered complete.

Since in both transistors the contact windows 19 to the source 32,42 and drain 33,43 are allowed to overlap the associated gate electrode 31,41, the electrical connections 20 of the source and drain may partly lie on the insulated gate electrode 31,41. As a consequence a very compact structure with a high packing density may be obtained. After the stage shown in FIG. 10, a comparatively thick passivating layer, e.g. of silicon nitride, may be provided.

Although the invention has been explained with reference to a single example, it will be obvious that the invention is by no means limited to the example given. Many variations are possible for those skilled in the art within the scope of the invention.

Materials other than silicon oxide may thus be used for the various insulating layers. Furthermore, the etch stop layer may be omitted under certain conditions, for example, when the oxide covering of the gate electrode is taken so thick that the contact windows can be safely etched, or when the material of the further insulating layer and the etchant for the contact windows on the one hand and the material of the second and third insulating layers on the other hand are so counterbalanced that a high etching selectivity of the further insulating layer relative to the second and third insulating layers is obtained.

Furthermore, the term "field effect transistor" should be given a wide interpretation within the scope of the invention. Thus the invention is also advantageously applicable to programmable read-only memories such as the so-called PROM, EPROM, EEPROM and Flash EPROM, in which case the gate electrode constitutes the floating gate of a memory transistor which can retain information in the form of charge stored thereon. Depending on the type of memory, the transistor in that case also comprises a further gate electrode to which the first electrode is capacitively coupled so that the cell can be electrically erased.

In general, the invention allows the realization of a semiconductor device comprising field effect transistors with a comparatively high packing density compared with devices in which contact windows to the source and the drain are to be aligned relative to the gate electrode.

We claim:

1. A method of manufacturing a semiconductor device whereby a field effect transistor is provided at a surface of a semiconductor body, which comprises the steps of:

providing a first insulating layer on the surface of the semiconductor body;

depositing a conductive layer on the first insulating layer;

providing a second insulating layer on the conductive layer;

selectively removing the second insulating layer from part of the conductive layer to expose a contact region of the conductive layer;

providing an etching mask which at least partly covers said contact region;

etching between portions of the etching mask and through the second insulating layer and the conductive layer to form a gate electrode;

implanting impurities on both sides of the gate electrode to form a source and a drain region of a first conductivity type mutually separated by a channel region of a second, opposite conductivity type under the gate electrode;

providing a third insulating layer over the resultant structure;

anisotropically etching the third insulating layer to form at least sidewalls on the gate electrode;

forming a contact window over the source and drain regions and a portion of the gate electrode; and providing an electrical connection in the contact window.

2. A method as claimed in claim 1, characterized in that the third insulating layer is also provided with a contact window at the area of the contact region of the conductive layer and in that an electrical connection is provided therein.

3. A method as claimed in claim 2, characterized in that at least the contact region of the conductive layer is covered with a dielectric, in that the dielectric is exposed in the contact window, and in that an electrical connection is provided via the contact window on the dielectric so as to form a capacitance electrode.

4. A method as claimed in claim 1, characterized in that, before the third insulating layer is provided, the semiconductor body on either side of the gate electrode is doped with an impurity of the first conductivity type so as to form a first, comparatively weakly doped portion of the source and the drain, and in that, after the portion along the gate electrode has been formed from the third insulating layer, the semiconductor body is once more doped with an impurity of the first conductivity type so as to form a second, comparatively heavily doped portion to the source and the drain.

5. A method as claimed in claims 1, characterized in that the second insulating layer comprises silicon oxide and is provided by deposition.

6. A method as claimed in claim 1, characterized in that, after the third insulating layer has been etched back anisotropically, the entire assembly is covered with an etch stop layer relative to which the further insulating layer is selectively etchable.

7. A method as claimed in claim 6, characterized in that the etch stop layer comprises a material from the group consisting of silicon nitride and aluminum oxide.

8. A method as claimed in claim 6, characterized in that a layer of flow glass is used for the third insulating layer, in that subsequently said contact window is provided therein and a heat treatment is carried out whereby the further insulating layer flows out, and in that the etch stop layer is not removed from the contact window until after the heat treatment.

* * * * *